United States Patent
Liao et al.

(10) Patent No.: US 12,062,562 B2
(45) Date of Patent: Aug. 13, 2024

(54) AIR CURTAIN FOR DEFECT REDUCTION

(71) Applicant: Taiwan Semiconductor Manufacturing Co., Ltd., Hsinchu (TW)

(72) Inventors: Wei-Chih Liao, Hsinchu (TW); Shih-Yu Tseng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/515,785

(22) Filed: Nov. 1, 2021

(65) Prior Publication Data

US 2022/0344190 A1 Oct. 27, 2022

Related U.S. Application Data

(60) Provisional application No. 63/178,367, filed on Apr. 22, 2021.

(51) Int. Cl.
*H01L 21/677* (2006.01)
*B65G 47/90* (2006.01)
*H01L 21/687* (2006.01)

(52) U.S. Cl.
CPC ........ *H01L 21/67742* (2013.01); *B65G 47/90* (2013.01); *H01L 21/67706* (2013.01); *H01L 21/67745* (2013.01); *H01L 21/67778* (2013.01); *H01L 21/68707* (2013.01)

(58) Field of Classification Search
CPC ........ H01L 21/67742; H01L 21/67745; H01L 21/67196
USPC ........................................ 432/22, 92
See application file for complete search history.

(56) References Cited

U.S. PATENT DOCUMENTS

| | | | | |
|---|---|---|---|---|
| 6,638,672 | B2 * | 10/2003 | Deguchi | G03F 7/7075 |
| | | | | 430/30 |
| 2007/0119393 | A1 * | 5/2007 | Ashizawa | H01L 21/67196 |
| | | | | 123/25 M |
| 2010/0236478 | A1 * | 9/2010 | Miyashita | C23C 16/54 |
| | | | | 118/719 |
| 2014/0329453 | A1 * | 11/2014 | Wala | E21F 1/006 |
| | | | | 454/168 |
| 2017/0253968 | A1 * | 9/2017 | Yahata | C23C 16/4412 |
| 2019/0096702 | A1 * | 3/2019 | Sakai | H01L 21/67207 |
| 2020/0135509 | A1 * | 4/2020 | Lin | H01L 21/3065 |
| 2022/0208574 | A1 * | 6/2022 | Dogome | H01L 21/67196 |
| 2022/0208576 | A1 * | 6/2022 | Dogome | H01L 21/67167 |
| 2022/0230898 | A1 * | 7/2022 | Dogome | H01L 21/67196 |

* cited by examiner

*Primary Examiner* — Gerald McClain
(74) *Attorney, Agent, or Firm* — Sterne, Kessler, Goldstein & Fox P.L.L.C.

(57) ABSTRACT

Air curtain devices can reduce defects on semiconductor wafers when implemented on a track equipped with robotic wafer transport. The air curtain devices can be added to one or more processing devices arranged along the track to prevent defects from landing on wafer surfaces. For example, the air curtain devices can prevent volatile organic solvent mist from drifting towards processing devices on the track and preventing contamination via a wafer transport system.

20 Claims, 7 Drawing Sheets

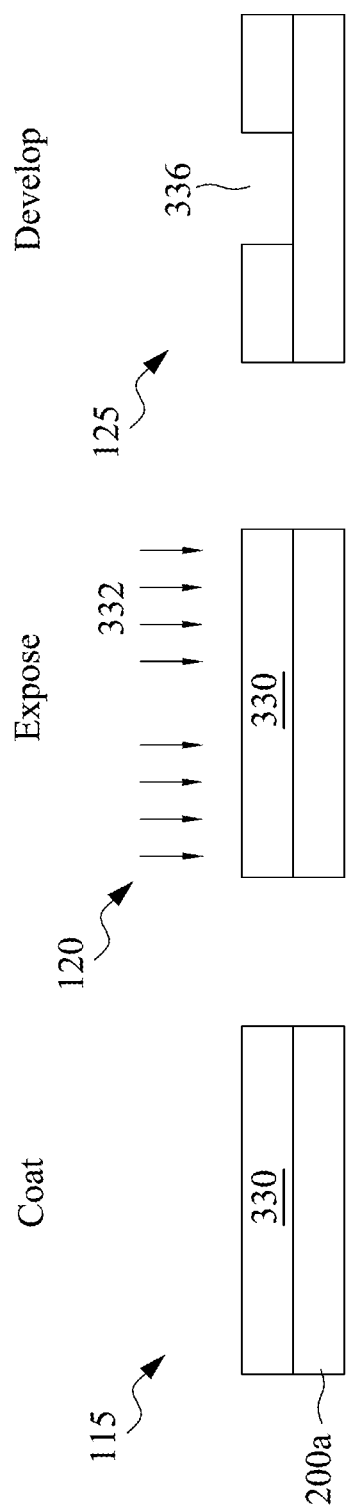
Fig. 3A
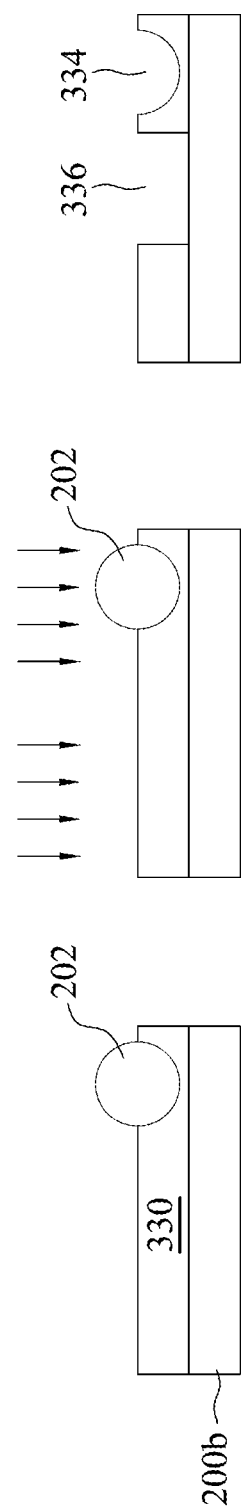
Fig. 3B
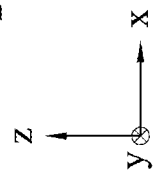

AIR CURTAIN FOR DEFECT REDUCTION

CROSS-REFERENCE TO RELATED APPLICATION

This patent application claims benefit of U.S. Provisional Patent Application No. 63/178,367, filed on Apr. 22, 2021 and titled "Air Curtain for Defect Reduction," which is incorporated by reference herein in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component or line that can be created using a fabrication process) has decreased. This scaling down process generally provides benefits by increasing production efficiency and lowering associated costs. However, scaling also increases vulnerability of devices to particles and places greater demands on the cleanliness of processing equipment.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. The dimensions of the various features may be arbitrarily increased or reduced for clarity of discussion.

FIG. 3A illustrates a patterning process, in accordance with some embodiments.

FIG. 3B illustrates an effect of vapor mist on a patterning process, in accordance with some embodiments.

DETAILED DESCRIPTION

Figure 1:
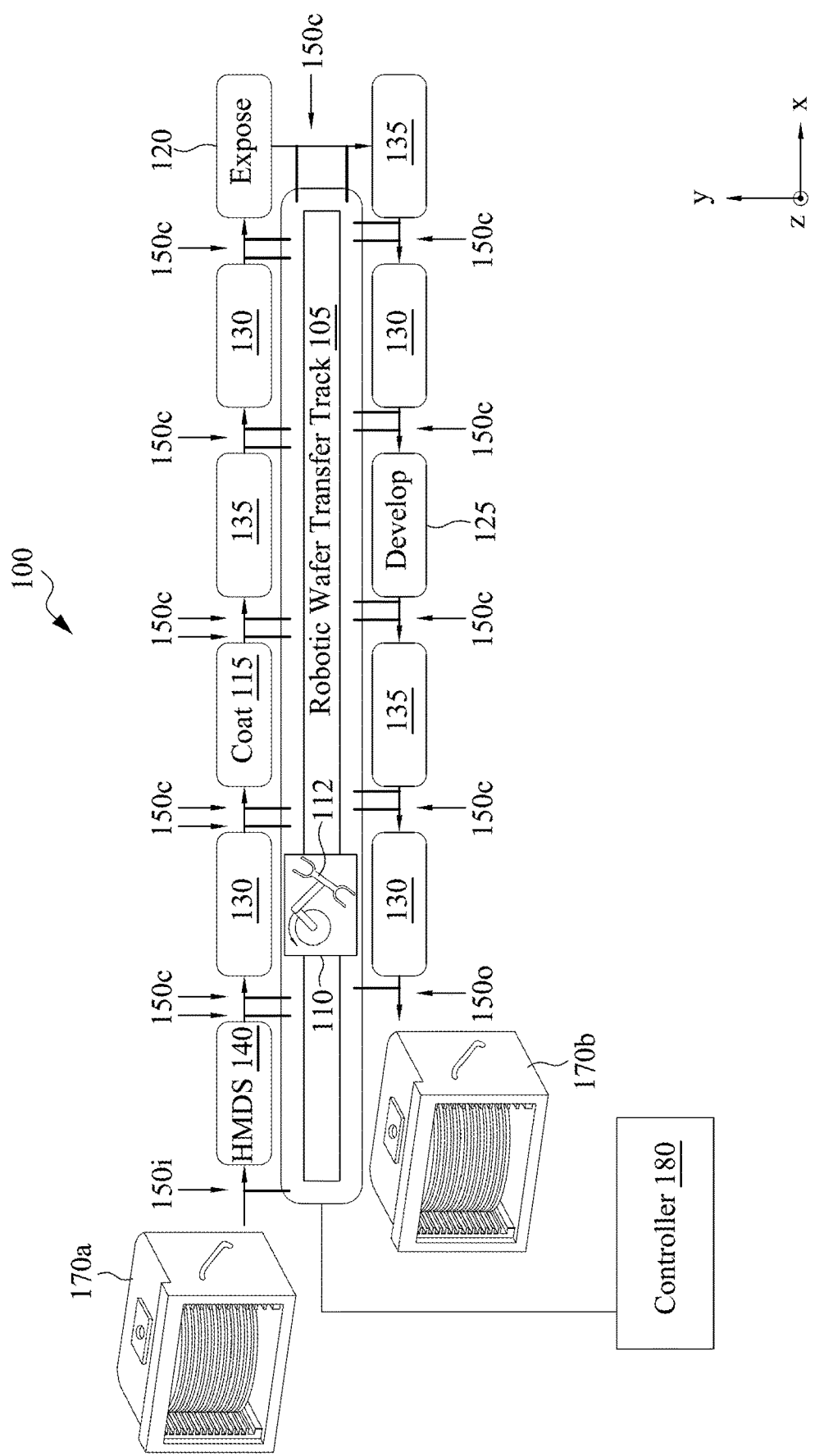
FIG. 1 is a top plan view of a wafer processing system equipped with air curtain devices, arranged around a track, in accordance with some embodiments.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature on a second feature in the description that follows may include embodiments in which the first and second features are formed in direct contact, and may also include embodiments in which additional features may be formed that are between the first and second features, such that the first and second features are not in direct contact.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in the relevant art in light of the teachings herein.

The term "vertical," as used herein, means nominally perpendicular to the surface of a substrate.

The term "processing unit" as used herein, refers to a processing module, a processing device, or a processing station of a wafer processing system.

The term "processing module," as used herein, refers to a unit or a device of a wafer processing system that adds or removes materials to/from a wafer.

The term "processing station," as used herein, refers to a unit or device of a wafer processing system that alters one or more physical characteristics of a wafer but does not modify materials on the wafer, for example, a heating or cooling plate that temporarily changes the temperature of the wafer, or a static discharge device.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

Throughout a chip manufacturing process, semiconductor wafers can be exposed to various chemicals, e.g., solvents, in the form of a liquid, vapor (gas), or an aerosol, characterized by a fine mist of droplets. Such a fine mist can spread from the vicinity of a wafer being processed to the vicinity of nearby wafers that are not in process. Semiconductor wafer processing systems can include multiple processing units serviced by a common, shared, robotic wafer transport system. Some wafer processing equipment sets can include processing units that are arranged in a circular configuration around a central robot. Other wafer processing equipment sets can include processing units arranged as stations disposed along a linear track, accessible by a robot that moves back and forth along the track. Some processing units can be under vacuum during processing and can have pumps and pressure controls that evacuate volatilized chemicals from a closed chamber after processing is complete. Such pumps and pressure controls can provide positive outward pressure during wafer transfer to reduce chamber contamination. Other processing modules can employ wet chemicals, such as solvents and other volatile compounds, in an open configuration instead of a closed chamber. The lack of full enclosure can subject neighboring wafers to unintended exposure to vapor mist. Consequently, the vapor mist from an open unit can potentially affect wafers in transit between units. For example, processing stations that provide localized heating or cooling of wafers between processing modules may not need to be enclosed. Wafers positioned on heating or cooling plates may then receive an unintended dose of vapor mist that migrates from neighboring processing modules. Some systems described herein address these problems by using air curtain devices to prevent migration of vapor mist between processing modules and stations.

FIG. 1 illustrates a wafer processing system 100 that can be part of a semiconductor manufacturing line, in accordance with some embodiments. Wafer processing system 100 is a modular equipment set that can be configured with, for example, main processing modules 115, 120, and 125, secondary processing modules 135, processing stations 130, a wafer prep module 140, air curtain devices 150$i$ and 150$o$, a wafer loading station 170$a$, a wafer unloading station 170$b$, and a controller 180. Wafer processing system 100 is further equipped with an automated wafer transport system, including a track 105 connecting wafer loading station 170$a$ with wafer unloading station 170$b$, and a robotic wafer transport device, or robot, 110 that has one or more robotic arms 112 for moving semiconductor wafers among the various modules and stations of wafer processing system 100. Semiconductor wafers introduced into processing modules and stations of wafer processing system 100 can include additional materials, such as glass, metal, dielectric, and polymers. Robot 110 operates according to a program stored in controller 180, as will be explained in further detail below, to extract individual wafers from a wafer carrier, such as a front opening unified pod (FOUP), and to move the wafers along track 105, and into and out of processing units adjacent to track 105, as processing is completed. Multiple wafers (e.g., a group of 25 wafers) can be stored and transported together in each FOUP.

In some embodiments, main processing modules 115, 120, and 125 can be either open or closed. For example, processing modules 115 and 125 can be configured as open processing modules, while processing module 120 is configured as a closed-chamber processing module. Open processing modules 115 and/or 125 can utilize volatile compounds, such as solvents, that produce vapor mist.

Wafer processing system 100 can be equipped with an external exhaust system for removing residual vapor mist. However, such external exhaust systems may not completely remove the residual vapor mist. To address this, in some embodiments, modules/stations within wafer processing system 100 can be further equipped with one or more air curtain devices 150 e.g., inner air curtain device 150$i$, outer air curtain device 150$o$ or combination air curtain devices 150$c$ that include both inner and outer air curtain devices. In some embodiments, air curtain devices 150 are installed at each entryway of each module/station. In some embodiments, air curtain devices 150 are installed at selected entryways, e.g., entrances or exits, of selected modules/stations associated with wafer processing system 100. Entryways to the modules/stations may or may not include a physical door. In some embodiments, an inner air curtain device 150$i$ or an outer air curtain device 150$o$ can be substituted for any combination air curtain device 150$c$ shown in FIG. 1.

The path of a wafer through wafer processing system 100 follows horizontal arrows shown in FIG. 1, through a coat—expose— develop process sequence for patterning wafers using a photoresist mask. Processing modules and stations shown in FIG. 1 are examples that can be subject to vapor mist from solvents used in the developing process. However, solvents and other volatile chemicals are used in many different processing equipment sets in semiconductor manufacturing, not limited to equipment used for patterning wafers. In the embodiment of FIG. 1, each of the main processing modules 115, 120, and 125 is followed by a secondary processing module 135, and a processing station 130.

In the embodiment shown in FIG. 1, the wafer path begins with wafers arriving at wafer loading station 170$a$. Robot 110 extracts a single wafer from wafer loading station 170$a$ and moves the wafer through inner air curtain 150$i$, into wafer prep module 140. Wafer prep module 140 is configured to treat the top surface of the wafer to facilitate subsequent process steps. For example, wafer prep module 140 can spin-coat the first wafer to distribute a few drops of hexamethyldisilazane (HDMS) applied to a top surface of the wafer. HDMS increases hydrophobicity of the wafer surface, thus improving adhesion of subsequent layers to be deposited. Hydrophobic wafers then move to processing station 130. Processing station 130 can be, for example, a temperature regulating plate, that either heats or cools the wafer, or a station that can provide both heating and cooling as needed. Alternatively, processing station 130 can provide a function such as discharging wafers, or similar functions that may not necessarily add or subtract material from the wafer.

Between wafer prep module 140 and processing station 130, the wafer is transferred through back-to-back combination air curtain devices 150$c$, into main processing module 115. At every subsequent module or station, the wafer can pass through similar back-to-back combination air curtain devices 150$c$ during transfer to and from the module/station. Main processing module 115 can be, for example, a coater module that spin-coats photoresist onto a top surface of the wafer. After coating, robot 110 moves the first wafer out of main processing module 115, to secondary processing module 135, for example, a post-coating station where a chemical can be applied, for example, to cross-link photoresist just deposited onto the wafer.

Next, robot 110 moves the wafer to another processing station 130, e.g., a temperature regulation station. Following processing station 130, the wafer is transferred into a chamber of main processing module 120 for, e.g., exposure of photoresist, through a mask, to a source of electromagnetic radiation. Following exposure, robot 110 moves the first wafer out of the chamber of processing module 120, to a secondary processing module 135, followed by another processing station 130. Meanwhile, robot 110 moves additional single wafers from wafer loading station 170$a$, through various processing modules and processing stations, and through associated combination air curtain devices 150$c$, and continues to backfill empty modules and stations with wafers from the FOUP.

Following the exposure sequence, robot 110 moves the first wafer to a developer processing module 125, where solvent vapor is used to develop exposed portions, or unexposed portions, of the photoresist, depending on the design and chemical properties of the photoresist material. In the example of FIG. 1, developer processing module 125 is a potential source of vapor mist that can damage wafers at adjacent processing stations 130, open secondary processing modules 135, or wafers in transit on arms of robot 110 as robot 110 moves along track 105. Following the developing step, robot 110 moves the wafer to another secondary processing module 135. Once the vicinity of track 105 and robot 110 are exposed to vapor mist, modules/stations adjacent to track 105 become vulnerable to contamination by condensation of droplets from the vapor mist.

When processing is complete at developer processing module 125, robot 110 moves the wafer to another secondary processing module 135 and then to another processing station 130. Finally, robot 110 moves the wafer through outer air curtain device 150o and into an empty FOUP waiting at wafer unloading station 170b.

Figure 2:
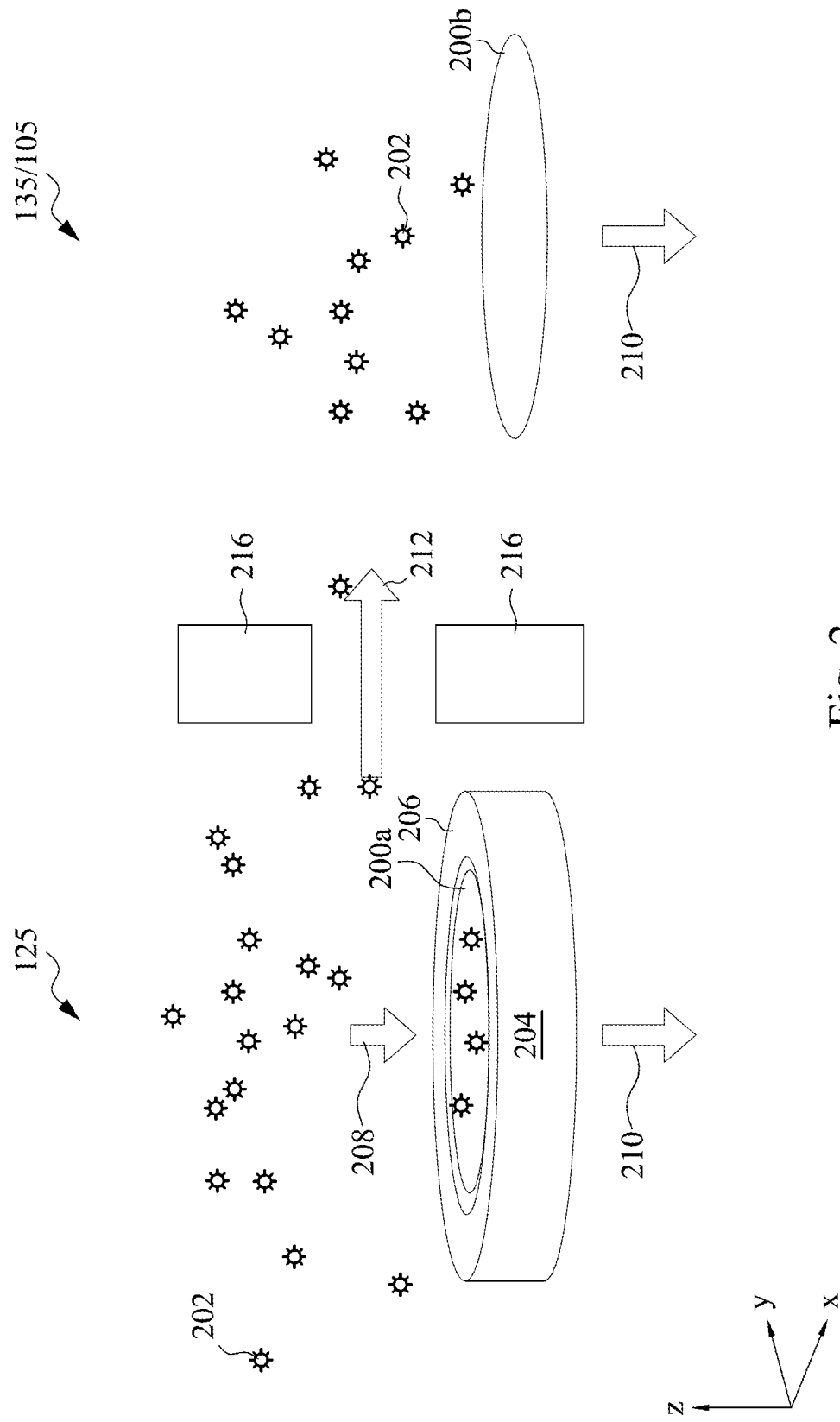
FIG. 2 is a side view of two adjacent wafer processing stations, in accordance with some embodiments.

FIG. 2 illustrates a magnified view of wafers 200 (two shown, 200a and 200b) associated with main processing module 125 (e.g., a developer module), adjacent to a location that can represent either a processing station 130 or track 105, in accordance with some embodiments. Wafer 200a, while in process at main processing module 125, is exposed to a vapor mist, e.g., a solvent used as a photoresist developer. The vapor mist includes mist droplets 202. Wafer 200a rests on a processing stage 204 having a top surface 206. Main processing module 125 may be open, or it may include a closed chamber. In either case, an exhaust flow 210 causes a vertically directed (e.g., in the z-direction) exhaust system pressure 208 to drive mist droplets 202 toward wafer 200a to induce a surface reaction at wafer 200a, such as removal of exposed or unexposed photoresist. In some embodiments, exhaust system pressure 208 can be in a range between about 2 Pascals and about 5 Pascals. Upon opening a door 216 to unload wafer 200a, exhaust flow 210 further causes a positive horizontal pressure 212 to drive mist droplets 202 outward from main processing module 125 toward a neighboring wafer 200b. The vicinity of neighboring wafer 200b is also subject to exhaust flow 210, which further drives mist droplets 202 onto a top surface of neighboring wafer 200b. Thus, neighboring wafer 200b can become contaminated by vapor mist, e.g.; developer mist that originates in main processing module 125.

FIGS. 3A and 3B show, by comparison, what can occur on an upper surface of neighboring wafer 200b as a result of the cross-contamination event described above in FIG. 2, in accordance with some embodiments. FIG. 3A shows a progression of the surface of wafer 200a through wafer processing system 100. Following treatment in process module 115 (coat), wafer 200a is coated with a surface layer 330 of a photosensitive layer, e.g., a photoresist made of polyimide. During exposure through a mask in main processing module 120 (expose), some portions of surface layer 330 receive a dose of electromagnetic energy (e.g., light energy) 332, while other portions of surface layer 330, such as the center as shown, are blocked by the mask. Affected portions can be strengthened by the electromagnetic energy 332 such that, while in process at main processing module 125 (develop) using a solvent, treated portions of surface layer 330 remain intact, while untreated areas are blocked by the mask, are dissolved, leaving behind a void 336. In contrast, FIG. 3B shows how contamination of surface layer 330 of neighboring wafer 200b occurs, as neighboring wafer 200b moves through wafer processing system 100. When, at processing module 115 (e.g., coat), droplet 202 from a nearby vapor mist lands on surface layer 330, droplet 202 blocks an additional unmasked portion of surface layer 330. Consequently, neighboring wafer 200b emerges from main processing module 125 having an additional void in the approximate shape of droplet 202, or "bubble defect" 334. Bubble defects 334 are not necessarily spherical—instead they may be distorted or have irregular shapes. Thus, bubble defects that are detected at particle monitors downstream of wafer processing system 100 in a semiconductor wafer manufacturing line can indicate insufficient or Obstructed exhaust flow 210.

Figure 4B:
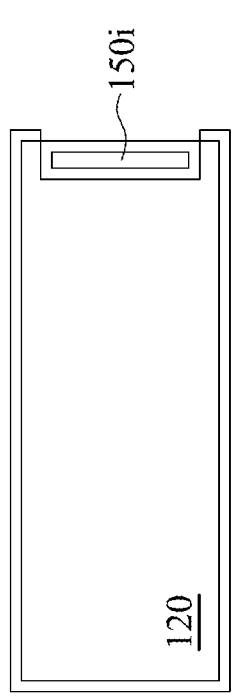
FIGS. 4B-4D are pictorial views of process chambers equipped with inner and outer air curtain devices, in accordance with some embodiments.
Figure 4C:
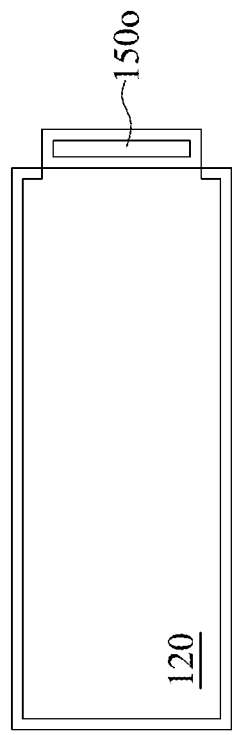
Figure 4D:
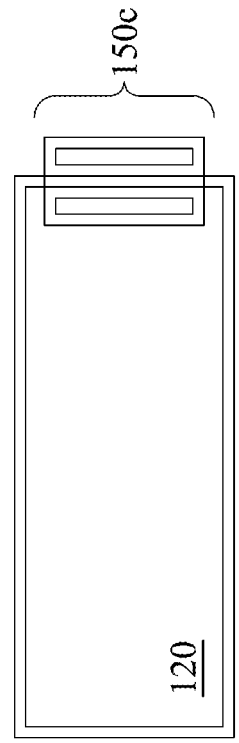
Figure 4A:
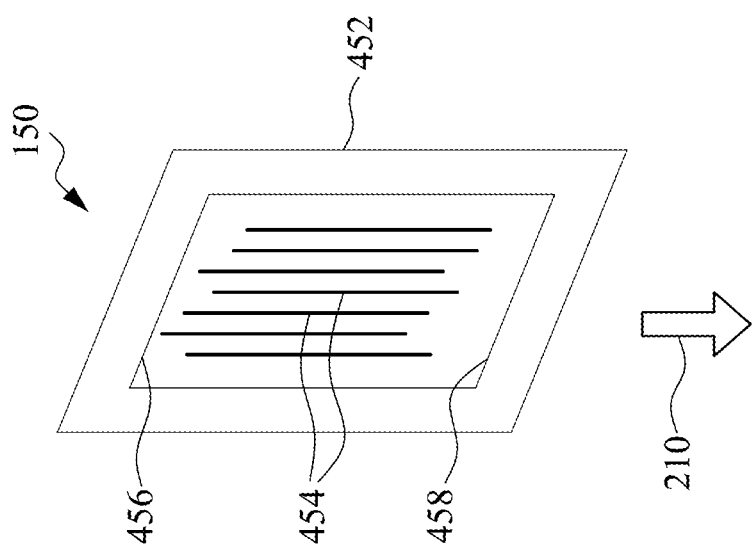
FIG. 4A is a perspective view of an air curtain device, in accordance with some embodiments.

FIG. 4A illustrates air curtain devices 150 that can shield wafers from contamination by solvent vapor mist and thus reduce the incidence of bubble defects on neighboring wafer 200b, in accordance with some embodiments. Air curtain devices 150 are configured to create an air curtain that moves an inert gas, under pressure, into a flow path of an exhaust system. In some embodiments, the air curtain may move ambient air. In some embodiments, air curtain device 150 may direct movement of an inert gas supplied to the air curtain device 150, for example, nitrogen gas ($N_2$), oxygen gas ($O_2$), or ozone ($O_3$). Each air curtain device 150 includes a frame 452 and a laminar gas flow 454 that is co planar with frame 452 and remains substantially within frame 452. Air curtain device 150 can include, for example, air ducts that force pressurized air to flow out from an upper inner surface 456 of frame 452 and into air ducts disposed along a lower inner surface 458 of frame 452. Air curtain devices 150 can be installed at entryways, e.g., entrances or exits of open or closed processing modules, in an orientation such that laminar flow 454 is substantially vertical and downward in the −z direction, commensurate with the path of exhaust flow 210. In this way, air curtain devices 150 assist exhaust pumps and contribute to exhaust flow 210.

In some embodiments, air curtain devices 150 are continuously active during operation of wafer processing system 100. In some embodiments, air curtain devices 150 are temporarily activated to create an air curtain prior to moving wafers into or out of a processing module or a processing station. Alternatively, activation of one or more air curtain devices 150 can be synchronized with operation of an entryway to which air curtain devices 150 are attached. For example, air curtain device 150 can be activated automatically by a trigger, for example, upon opening a module door, and then de-activated when the module door is shut. Conversely, module doors can be triggered to open or close in response to activation or deactivation of air curtain device 150. Synchronization of air curtain device 150 with entryways (e.g., doors) of processing modules or stations can be coordinated locally or under centralized control by controller 180. In some embodiments, operation of multiple air curtain devices 150 can be synchronized or coordinated with one another, so that, for example, when an inner air curtain device 150i is activated, an associated air curtain device 150o is also activated. In some embodiments, activation of air curtain devices 150 can be synchronized or coordinated with robot motions, by controller 180, or with electronic sensors associated with a module/station entryway.

In some embodiments, operation of air curtain devices 150 can be electronically coupled to, or otherwise coordinated with, operation of an exhaust system via controller 180. For example, controller 180 can activate air curtain devices 150 automatically while exhaust pumps are also active so that laminar flow 454 merges with exhaust flow 210.

FIGS. 4B, 4C, and 4D illustrate various configurations of air curtain devices 150 for enhancing processing modules, in accordance with some embodiments. A main processing module (e.g., processing module 120) that is enclosed or partially enclosed can support installation of inner air curtain devices 150i placed within an enclosure of the processing module (FIG. 4B), outer air curtain devices 150o disposed outside an enclosure of the processing module (FIG. 4C), or combination air curtain devices 150c disposed both inside and outside an enclosure of the processing module (FIG. 4D). For secondary processing modules 135 or processing stations 130 that are not enclosed, a frame or a base can be constructed to support one or more air curtain devices 150.

Figure 5A:
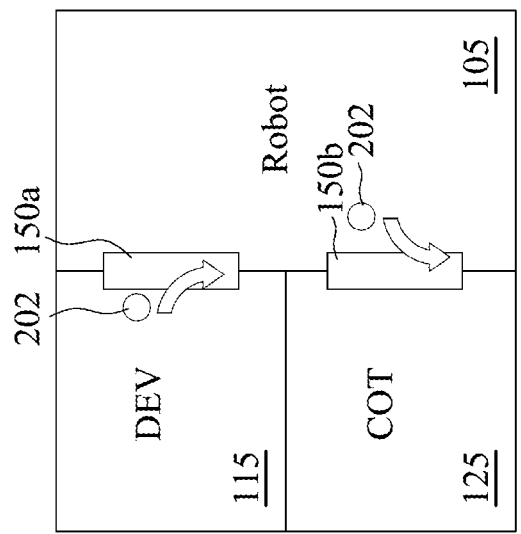
FIG. 5A is a top plan view of two adjacent wafer processing stations serviced by a common robot, in accordance with some embodiments.
Figure 5B:
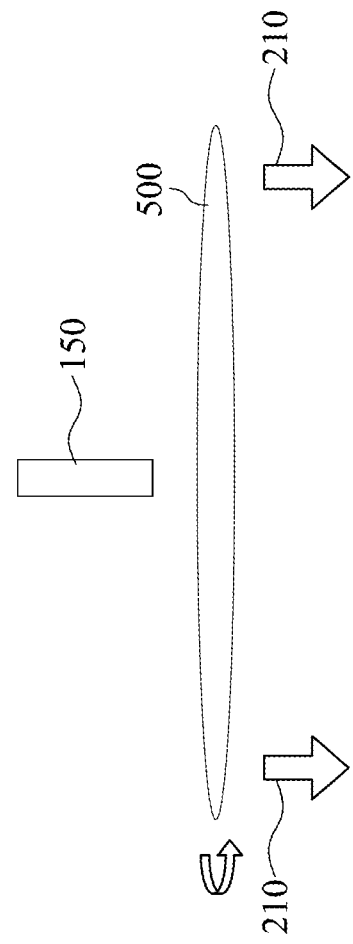
FIG. 5B is a side elevation view of a wafer processing module equipped with an exhaust system, in accordance with some embodiments.

FIGS. 5A and 5B illustrate implementation of air curtain devices 150 between robot wafer transfer track 105 and main processing modules 115 (coat) and 125 (develop), respectively, in accordance with some embodiments. The top-down view in FIG. 5A shows air curtain device 150 installed at a module door of the developer main processing module 115. Developer main processing module 115 is a source of droplets 202 from a vapor mist. When the module door equipped with air curtain device 150 opens to unload a wafer, droplet 202 is diverted downward (e.g., in the −z direction) by air curtain device 150a so that droplets are not present above the wafer while it is transported by robot 110 to robot wafer transfer track 105. Wafers at coat main processing module 115 remain on an arm of robot 110 while the module door is opened. Droplets 202 that reside on or around robot wafer transfer track 105 are then diverted downward by air curtain device 150 before transporting the wafer into coat main processing module 125. In this way, air curtain devices 150 disposed above a plane of wafer processing cooperate with exhaust flow 210, disposed below plane of wafer processing 500, to remove vapor mist from wafer processing system 100, as shown in the side view of FIG. 5B. In some instances, plane of wafer processing 500 can be interpreted as a factory floor. In some instances, plane of wafer processing 500 can be interpreted as a wafer chuck, a chamber surface, or other horizontal plane associated with wafer processing system 100. Thus, air curtain device 150 can be directly coupled or indirectly coupled to an exhaust system associated with exhaust flow 210.

Figure 6:
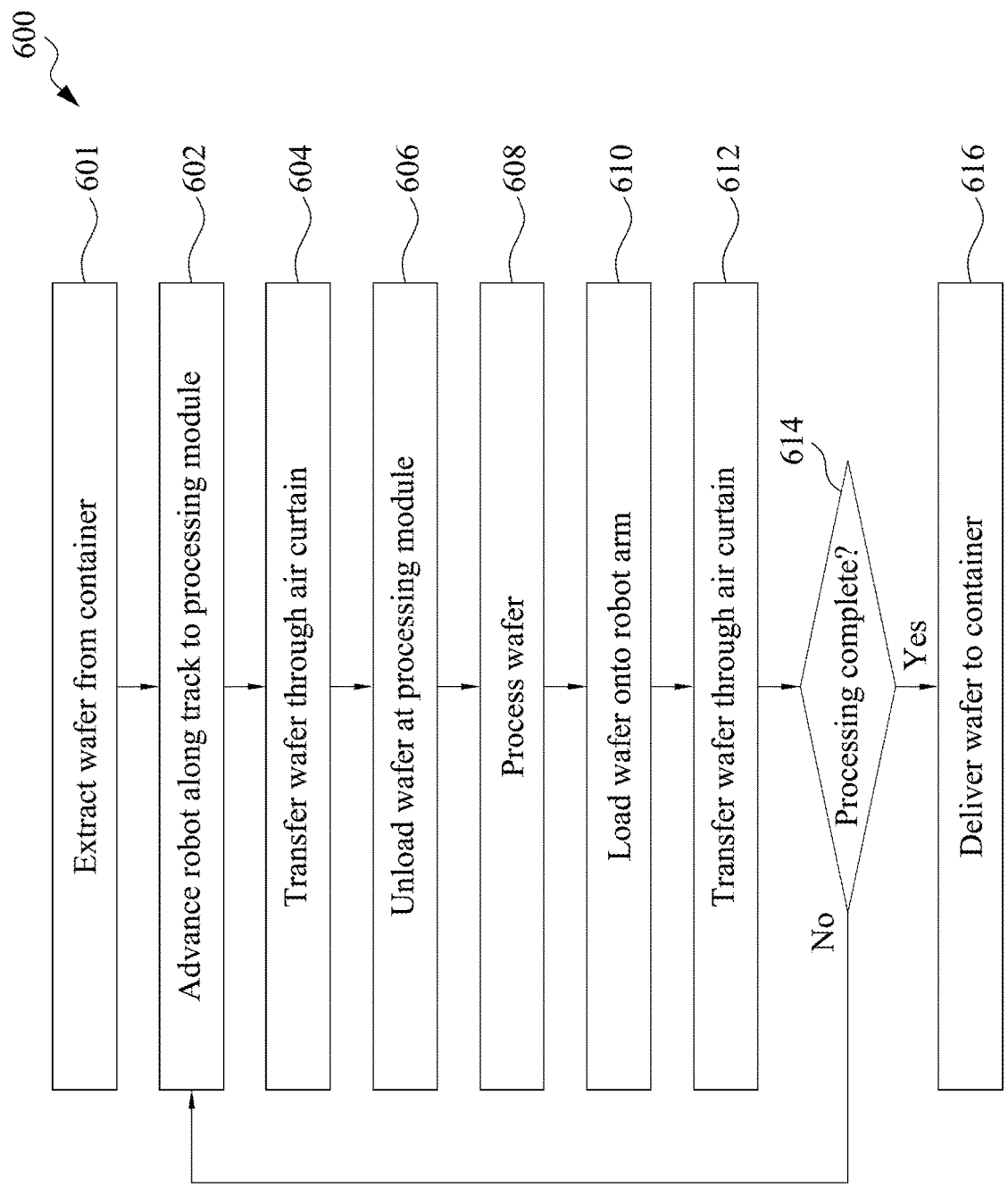
FIG. 6 is a flow diagram of a transfer process for moving a wafer along a track as shown in FIG. 2, in accordance with some embodiments.

FIG. 6 is a flow diagram illustrating operations in a method 600 for performing a transfer sequence among modules of wafer processing system 100, in accordance with some embodiments. Method 600 proceeds according to a program stored in, and executed by, controller 180 to direct motion of robot 110.

At 601, a wafer is extracted from a container (e.g., a FOUP) onto a transfer arm of robot 110. At 602, robot 110 advances along track 105 towards a processing module. At 604, the water is transferred through an air curtain device 150. At 606, the wafer is unloaded at the processing module. At 608, the water is processed in the processing module. At 610, the water is loaded onto the transfer arm of robot 110. At 612, the wafer is transferred through air curtain device 150. At 614, when it is determined that processing is complete, robot 110 advances the wafer to an unload station and at 616 delivers the wafer from the transfer arm to the container. Otherwise, when it is determined at 614 that processing is not complete, robot 110 advances the wafer to the next processing module and operations 602, 604, 606, 608, 610, 612, and 614 are repeated.

Over time, the incidence of bubble defects detected in line can escalate, caused by an accumulation of particles in closed modules, or at stations, of wafer processing system 100. Particles can originate in any of the associated modules or stations along track 105, and can be transferred among the various modules and stations via robot 110, potentially contaminating any number of components of wafer processing system 100. Semiconductor processing equipment can be monitored for particles periodically by performing a process on a test wafer and then scanning the surface of the test wafer to determine how many defects landed on the test wafer while it was in the equipment or in a particular module or station. Over time, processing modules/stations become contaminated as evidenced by an increase in particles detected on test wafers. Equipment maintenance can be performed at regular intervals, or on an ad-hoc basis, e.g., upon detection of a threshold particle count. Following maintenance and/or cleaning activities, the particle count can decrease to zero or near zero, and then increases again over time to tens or hundreds of particles.

Figure 7:
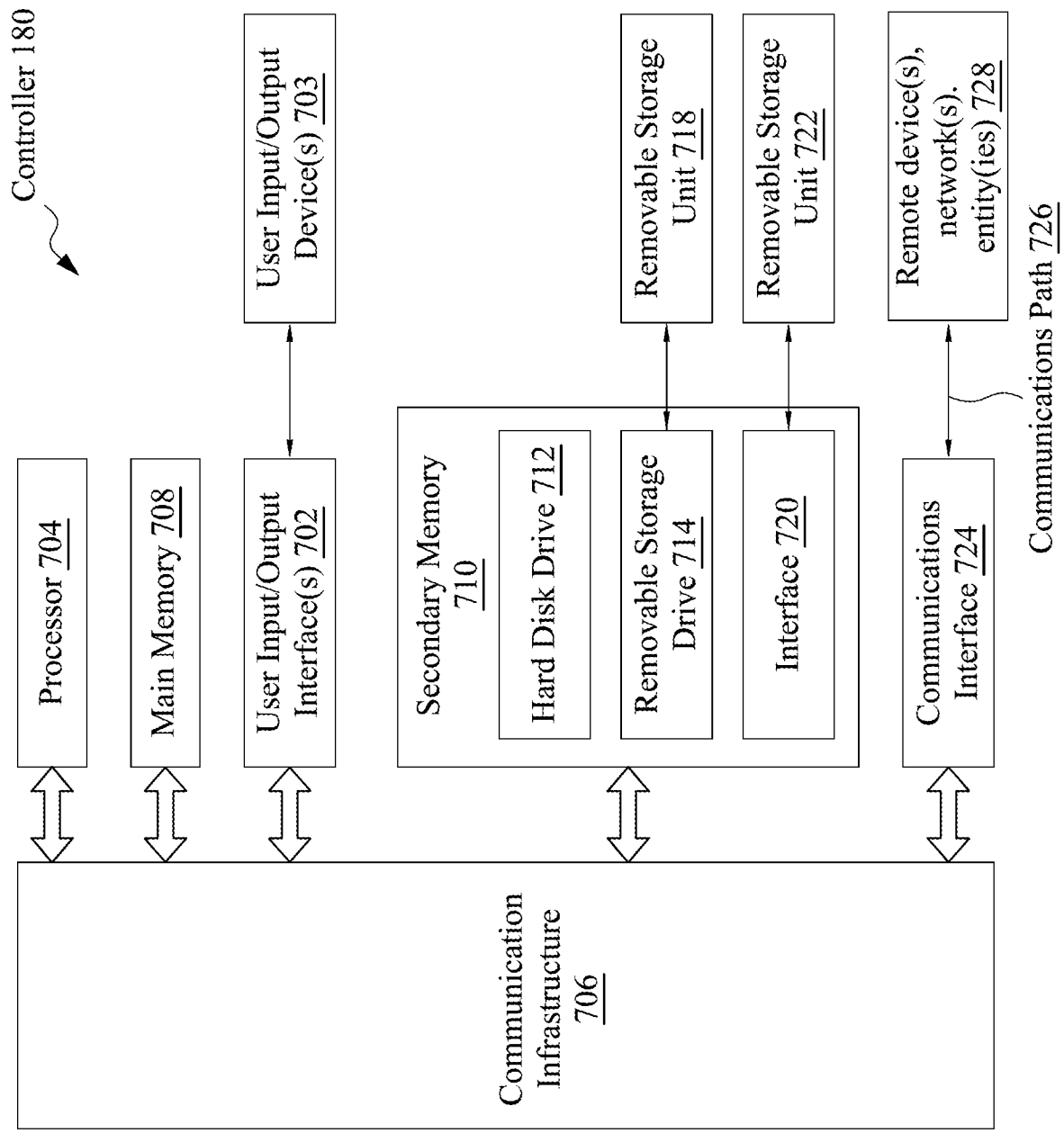
FIG. 7 is a block diagram of a controller for a wafer processing system equipped with air curtain devices, in accordance with some embodiments.

Following implementation of air curtain devices 150 at each processing module, and at each station of wafer processing system 100, measured particles are projected to decrease to levels on the order of a few particles, consistent with air curtain devices 150 having a similar effect to a maintenance event. Alternatively, air curtain devices 150 can be deployed at selected processing modules and/or at selected stations of wafer processing system 100. Both inner and outer FIG. 7 is an illustration of an example controller 180 of FIG. 1, in which various embodiments of the present disclosure can be implemented. Controller 180 can be any type of computer or computer system capable of performing the functions and operations described herein. Controller 180 can be used, for example, to execute one or more operations in method 600 of FIG. 6, for coordinating motion of an automated transport device, e.g., robot 110 of FIG. 1, to move wafers through processing modules and stations arranged along track 105 of FIG. 1. Controller 180 can be further configured to coordinate motion of the automated wafer transport device with operation of processing modules and stations 115, 120, 125, 130, 135, and 140, and air curtain devices 150.

Controller 180 includes one or more processors 704 (e.g., central processing units, or CPUs). Processor 704 is electrically and communicatively coupled to a communication infrastructure or bus 706. Controller 180 also includes input/output device(s) 703, such as monitors, keyboards, pointing devices, etc., that communicate with communication infrastructure 706 through input/output interface(s) 702. Robot 110 and/or wafer processing system 100 can receive instructions from controller 180 to implement functions and operations described herein—e.g., method 600 of FIG. 6—via input/output device(s) 703. Controller 180 also includes a main or primary memory 708, such as random access memory (RAM). Main memory 708 can include one or more levels of cache. Main memory 708 has stored therein control logic (e.g., computer software) and/or data. In some embodiments, control logic and/or data relates to one or more of the operations described above with respect to method 600 of FIG. 6.

Controller 180 can also include one or more secondary storage devices or memory 710. Secondary memory 710 can include, for example, a hard disk drive 712, a solid state disk, and/or a removable storage device or drive 714. Removable storage drive 714 can be a floppy disk drive, a magnetic tape drive, a compact disk drive, an optical storage device, tape backup device, removable solid state disk, flash memory device, and/or any other storage device/drive.

Removable storage drive 714 can interact with a removable storage unit 718. Removable storage unit 718 includes a computer usable or readable storage device having stored thereon computer software (control logic) and/or data. Removable storage unit 718 can be a floppy disk, magnetic tape, compact disk, DVD, optical storage disk, flash memory device, and/or any other computer data storage device. Removable storage drive 714 reads from and/or writes to removable storage unit 718 in a well-known manner.

According to some embodiments, secondary memory 710 can include other means, instrumentalities or other approaches for allowing computer programs and/or other instructions and/or data to be accessed by controller 180. Such means, instrumentalities or other approaches can include, for example, a removable storage unit 722 and an interface 720. Examples of the removable storage unit 722 and the interface 720 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface. In some embodiments, secondary memory 710, removable storage unit 718, and/or removable storage unit 722 can include one or more of the operations described above with respect to method 600 of FIG. 6.

Controller 180 can further include a communication or network interface 724. Communication interface 724 enables controller 180 to communicate and interact with any combination of remote devices, remote networks, remote entities, etc. (individually and collectively referenced by reference number 728). For example, communication interface 724 can allow controller 180 to communicate with remote devices 728 over communications path 726, which can be wired and/or wireless, and which can include any combination of LANs, WANs, the Internet, WiFi, and the like. Control logic and/or data can be transmitted to and from controller 180 via communication path 726. For example, controller 180 can communicate with robot 110 via a wireless communication path 726, such as a WiFi, Bluetooth™, and infrared connection.

Operations in the preceding embodiments can be implemented in a wide variety of configurations and architectures. Therefore, some or all operations in the preceding embodiments—e.g., method 600 of FIG. 6—can be performed in hardware, software or both. In some embodiments, a tangible apparatus or article of manufacture comprising a tangible computer useable or readable medium having control logic (software) stored thereon is also referred to herein as a computer program product or program storage device. Instructions for implementing operations described herein can be codified in, or hard-wired as, Application Specific Integrated Circuits (ASICs). Program storage devices can include, but are not limited to, controller 180, main memory 708, secondary memory 710 and removable storage units 718 and 722, as well as tangible articles of manufacture embodying any combination of the foregoing. Such control logic, when executed by one or more data processing devices (such as controller 180), causes such data processing devices to operate as described herein.

When implemented along track 105 equipped with robotic wafer transport, and under coordination by controller 180, air curtain devices 150 can reduce defects on semiconductor wafers. Air curtain devices 150 can be added to one or more processing units arranged along track 105 to prevent defects from landing on wafer surfaces. For example, air curtain devices 150 can prevent volatile organic solvent mist from drifting towards processing modules or stations adjacent to track 105. Air curtain devices 150 can also prevent or decrease contamination of wafers exposed to track 105 via common robot arm 112. The efficacy of air curtain devices 150 can be enhanced by installing inner and outer air curtain devices, 150i and 150o, at multiple entryways to each processing module, in accordance with some embodiments.

In some embodiments, a system includes: a wafer loading station; a wafer unloading station; a processing device configured to process wafers and including one or more entryways; a wafer transport system that includes a track connected to the wafer loading station, the wafer unloading station, and the processing device; and a robotic arm configured to move the wafers from the wafer loading station, into and out of the wafer processing device, and to the wafer unloading station; an air curtain device positioned at each of the one or more entryways to shield the wafers from contamination when the wafers are being processed by the processing device; and a controller configured to coordinate a motion of the robotic arm, the processing device, and the air curtain device.

In some embodiments, a method includes: advancing a wafer to a process module; transferring the wafer through an air curtain; unloading the wafer at the process module; processing the wafer in the process module; transferring the processed wafer through the air curtain; and advancing the processed wafer to an unloading station.

In some embodiments, a semiconductor wafer processing system includes: a wafer loading station; a wafer unloading station; a track connecting the wafer loading station and the wafer unloading station; a plurality of wafer processing devices arranged along the track; a wafer transport system configured to transport wafers among the wafer processing devices, the wafer loading station, and the wafer unloading station; and an air curtain device at an entryway of one or more of the wafer processing devices, where the air curtain device is configured to prevent contaminant particles from landing on the wafers.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A system, comprising:
a wafer loading station;
a wafer unloading station;
a first processing device comprising a first entryway;
a second processing device comprising a second entryway facing the first entryway, wherein the first and second processing devices are configured to perform one or more semiconductor processing operations on a surface of a wafer;
a first air curtain device and a second air curtain device positioned at the first entryway and the second entryway, respectively, and between the first and second processing devices to shield the wafer from contamination associated with the one or more semiconductor operations performed by the first and second processing devices, wherein the first and second air curtain devices are configured to generate a substantially vertical and downward laminar flow between upper air ducts and lower air ducts supported by a frame, the vertical and downward laminar flow remaining substantially within the frame, and wherein one or more of the first and second air curtain devices comprise an inner air curtain device and an outer air curtain device; and a wafer transport system, comprising:
- a track connected to the wafer loading station, the wafer unloading station, and the first and second processing devices; and
- a robotic arm configured to move the wafer from the wafer loading station, into and out of the first and second processing devices through the first and second air curtain devices, and to the wafer unloading station; and a controller configured to coordinate a motion of the robotic arm, the first and second processing devices, and the first and second air curtain devices.

2. The system of claim 1, wherein one or more of the first and second processing devices are configured to process the wafer using a solvent, and wherein the solvent is a liquid, a vapor, a gas, or an aerosol.

3. The system of claim 1, wherein the laminar flow comprises inert gas comprising one or more of air, nitrogen ($N_2$), oxygen ($O_2$), and ozone ($O_3$).

4. The system of claim 1, further comprising:
an additional processing device having one or more additional entryways; and
an additional air curtain device positioned at each of the one or more additional entryways to shield the wafer from contamination.

5. The system of claim 4, wherein the first processing device, the second processing device, and the additional processing device are positioned along the track, and wherein the robotic arm loads and unloads the wafer into and out of the first processing device, the second processing device, and the additional processing device.

6. The system of claim 4, wherein the additional processing device is an enclosed processing module configured to add or remove material from the wafer.

7. The system of claim 1, wherein the first and second air curtain devices are configured to activate upon activation of the first and second processing devices, respectively, and wherein activation of the first and second processing devices comprises one or more of a power-on procedure, a door opening procedure, and a start-up procedure.

8. The system of claim 1, wherein the first processing device is a coating module and the second processing device is a developer processing module.

9. The system of claim 1, wherein one or more of the first and second air curtain devices are configured to flow an inert gas, under pressure, towards an exhaust system.

10. The system of claim 9, wherein the pressure is between about 2 Pascals and about 5 Pascals.

11. The system of claim 1, wherein one or more of the first and entryways are open.

12. The system of claim 1, wherein each of the first and second air curtain devices comprises an inside air curtain and an outside air curtain for each of the first and second processing devices, respectively.

13. A method, comprising:
transferring a wafer through first air curtains of a processing module, wherein the first air curtains are disposed inside and outside of the processing module;
performing a first semiconductor processing operation on a surface of the wafer in the processing module;
transferring the wafer through the first air curtains and through second air curtains disposed inside and outside of an adjacent processing module, wherein openings of the second air curtains face openings of the first air curtains; and
performing a second semiconductor processing operation on the surface of the wafer.

14. The method of claim 13, wherein transferring the wafer through the first air curtains comprises exposing the wafer to a gas that is under pressure to flow into an exhaust system.

15. The method of claim 13, further comprising, after performing the second semiconductor operation, transferring the wafer from a wafer unloading station to a container.

16. The method of claim 13, wherein one or more of performing the first semiconductor processing operation and performing the second semiconductor processing operation comprises processing the wafer using a solvent, and wherein the solvent is a liquid, a vapor, a gas, or an aerosol.

17. A semiconductor wafer processing system, comprising:
a wafer loading station;
a wafer unloading station;
a track connecting the wafer loading station and the wafer unloading station;
a plurality of wafer processing devices arranged along the track;
a wafer transport system configured to transport wafers among the wafer processing devices, the wafer loading station, and the wafer unloading station; and
an air curtain device at entryways of at least two adjacent wafer processing devices of the plurality of wafer processing devices, wherein the entryways of the at least two adjacent wafer processing devices face one another, and wherein the air curtain device comprises an inner air curtain device and an outer air curtain device.

18. The semiconductor wafer processing system of claim 17, further comprising a controller configured to synchronize operation of the air curtain device with operation of the entryways to which the air curtain device is attached.

19. The semiconductor wafer processing system of claim 17, wherein the plurality of wafer processing devices are configured to perform one or more semiconductor processing operations on surfaces of wafers.

20. The semiconductor wafer processing system of claim 17, further comprising a controller configured to coordinate motion of a robotic arm to transfer the wafers into and out of the plurality of wafer processing devices and through the air curtain device.

* * * * *